United States Patent
Calciu et al.

(10) Patent No.: US 11,502,673 B1
(45) Date of Patent: Nov. 15, 2022

(54) DEVICES AND METHODS FOR DETERMINING AND INDICATING A SOURCE OF POWER BASED ON A CHARACTERISTIC OF RECEIVED POWER

(71) Applicant: Lenovo Global Technology (United States) Inc., Morrisville, NC (US)

(72) Inventors: Corneliu Ilie Calciu, Bucharest (RO); Robert Wolford, Strongsville, OH (US); James Mclean, Raleigh, NC (US); Gavril Ioan Florian, Bucharest (RO); Radu Iorga, Bucharest (RO)

(73) Assignee: Lenovo Global Technology (United States) Inc., Morrisville, NC (US)

( * ) Notice: Subject to any disclaimer, the term of this patent is extended or adjusted under 35 U.S.C. 154(b) by 0 days.

(21) Appl. No.: 17/363,501

(22) Filed: Jun. 30, 2021

(51) Int. Cl.
| | |
|---|---|
| *G01R 19/15* | (2006.01) |
| *H03K 5/24* | (2006.01) |
| *G01R 21/133* | (2006.01) |
| *G08B 5/36* | (2006.01) |
| *G08B 21/18* | (2006.01) |

(52) U.S. Cl.
CPC ............ *H03K 5/24* (2013.01); *G01R 21/133* (2013.01); *G08B 5/36* (2013.01); *G08B 21/18* (2013.01)

(58) Field of Classification Search
USPC .... 340/657, 568.1, 660, 658–659, 680, 661, 340/693.1, 825.19, 10.34, 310.11, 310.13
See application file for complete search history.

(56) References Cited

U.S. PATENT DOCUMENTS

| | | | | |
|---|---|---|---|---|
| 7,292,013 | B1 * | 11/2007 | Chen | G05F 1/70 323/299 |
| 7,693,678 | B2 * | 4/2010 | Cheng | G01K 7/346 438/54 |
| 8,166,012 | B2 * | 4/2012 | Reddy | G06F 16/285 707/705 |
| 8,750,393 | B1 * | 6/2014 | Alshinnawi | H02J 13/00017 375/257 |
| 2005/0008028 | A1 * | 1/2005 | Efrati | H04L 45/00 370/464 |
| 2011/0148202 | A1 * | 6/2011 | Rada | G05F 1/70 307/105 |
| 2019/0385512 | A1 * | 12/2019 | Lee | H01L 27/156 |
| 2020/0003809 | A1 * | 1/2020 | Marwali | G01R 19/2513 |

OTHER PUBLICATIONS

Li, Yang et al., CapMaestro: Exploiting Power Redundancy, Data Center-Wide Priorities, and Stranded Power for Boosting Data Center Performance, RC25680 (AUS1711-001), Computer Science, Mar. 28, 2018.

* cited by examiner

*Primary Examiner* — Daniel Previl
(74) *Attorney, Agent, or Firm* — Olive Law Group, PLLC

(57) ABSTRACT

Devices and methods for determining and indicating a source of power based on a characteristic of received power are disclosed. According to an aspect, a device includes a power line interface configured to receive power from multiple power lines. The device also includes a comparator module configured to compare one or more characteristics of the received power from the plurality of power lines. The comparator module is also configured to determine whether the received power on the power lines are from the same source based on the comparison. Further, the device includes a user interface configured to indicate whether the received power on the power lines are from the same source based on the determination.

20 Claims, 8 Drawing Sheets

DEVICES AND METHODS FOR DETERMINING AND INDICATING A SOURCE OF POWER BASED ON A CHARACTERISTIC OF RECEIVED POWER

TECHNICAL FIELD

The presently disclosed subject matter relates generally to power delivery systems. Particularly, the presently disclosed subject matter relates to devices and methods for determining and indicating a source of power based on a characteristic of received power.

BACKGROUND

Data centers are buildings with dedicated space for housing computer servers. For highly-available data centers, the power distribution infrastructure typically relies on redundancy at multiple levels to ensure reliable power delivery to servers. There can be multiple power supplies and multiple utility feeds into the data center. Such redundancy can ensure continued availability of full power demand in the event of failure of some of the power devices at each level.

At the server rack level, multiple power feeds may be used to support redundancy. The multiple feeds are each connected by a power line to a rack's power distribution unit (PDU), which is capable of supporting the full load of the rack's equipment. Also, a server of a chassis includes multiple power supply modules to provide redundancy in case of a module failure, or a power line or cable failure. However, even if a server has multiple power supply modules, the redundancy is affected if all its power inputs are connected to the same power source or power line/cable. For example, power lines to a server should be connected to different source lines of power, but there is no redundancy if an installer or other operator of the equipment mistakenly connects the power lines of the server to the same line of power. Therefore, it is desired to provide equipment and techniques to avoid misconfiguration of power line connections to a server or other computing equipment.

BRIEF DESCRIPTION OF THE DRAWINGS

Figure 1:
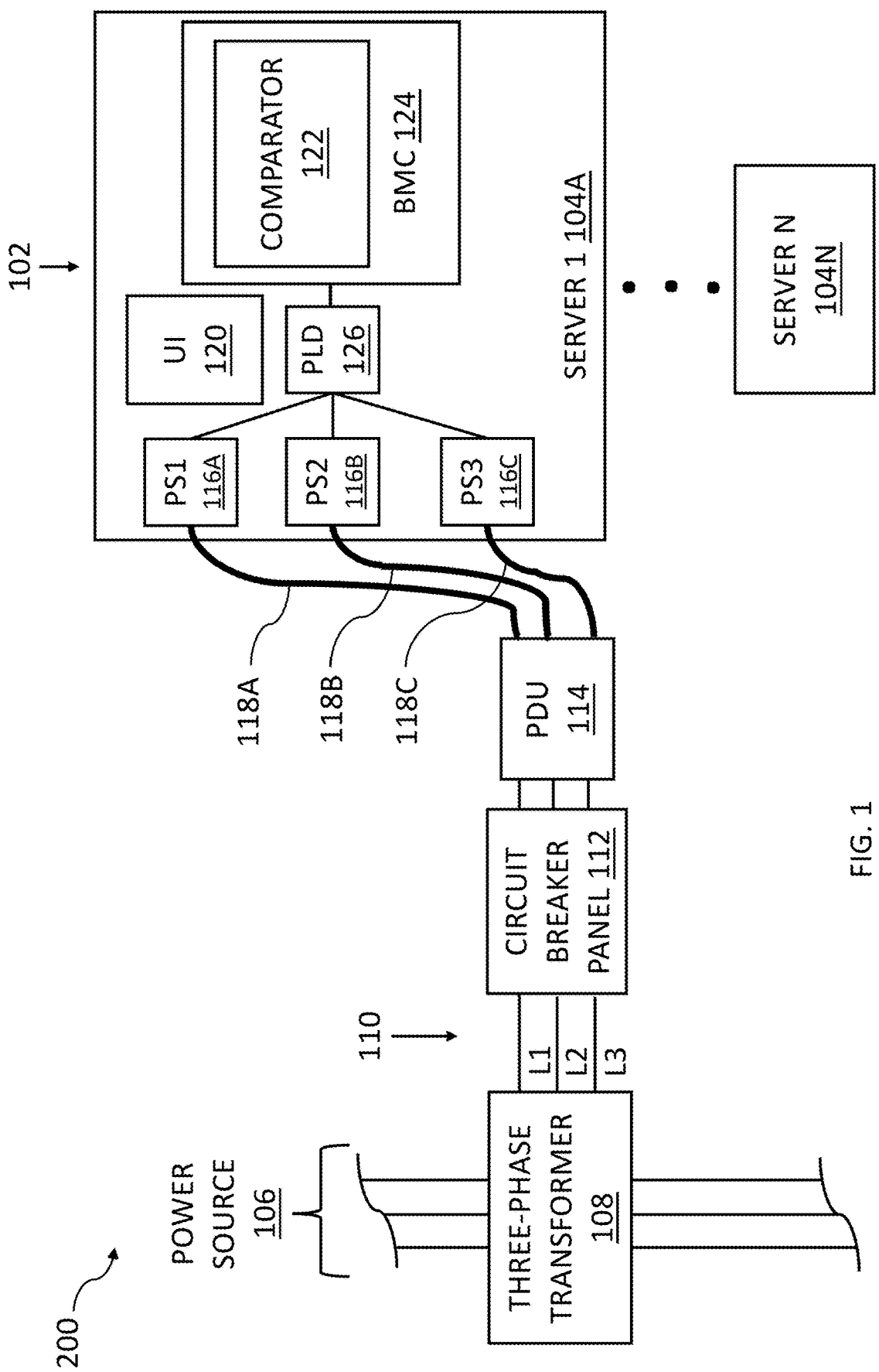
Figure 2:
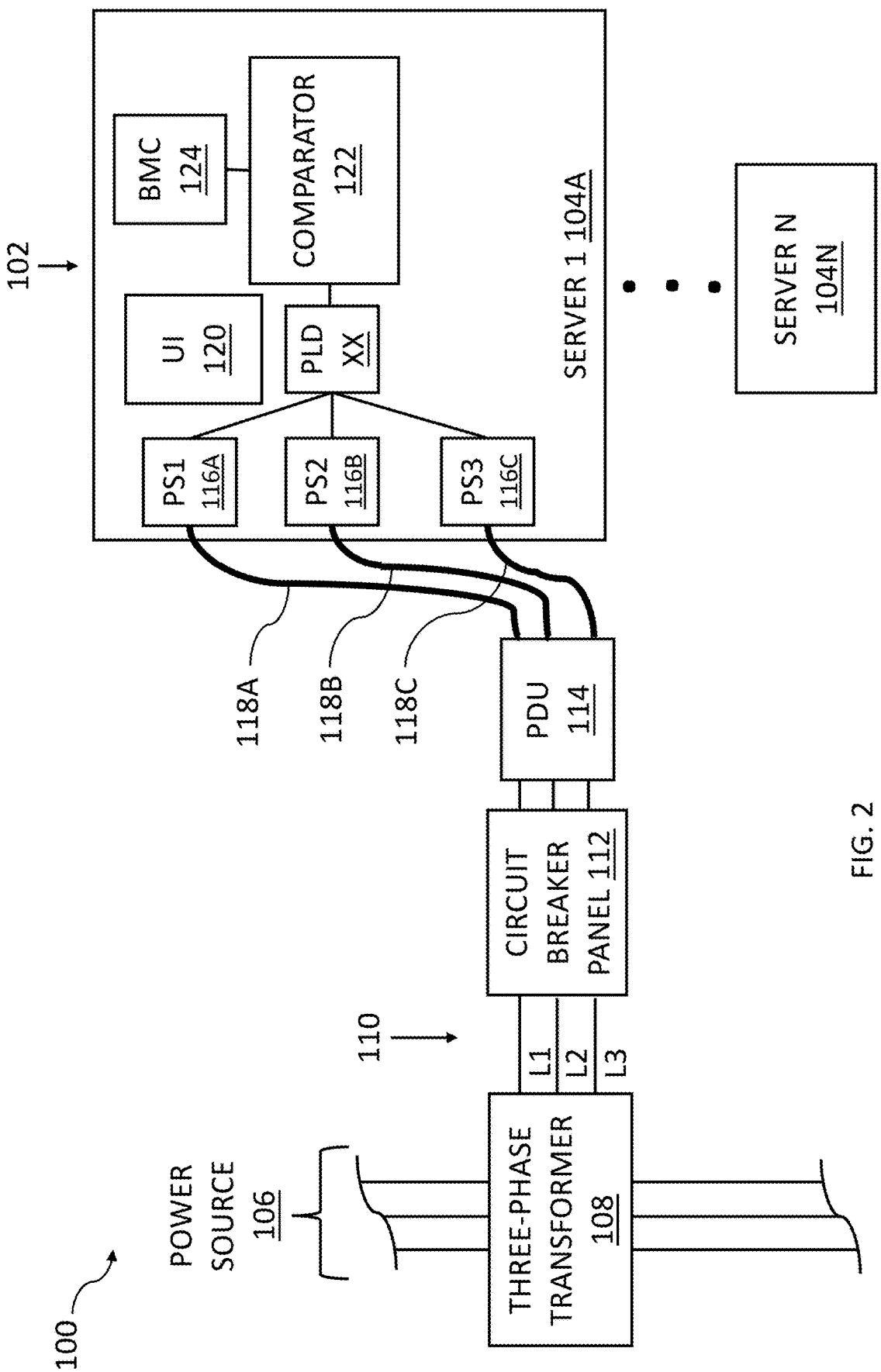
Figure 3:
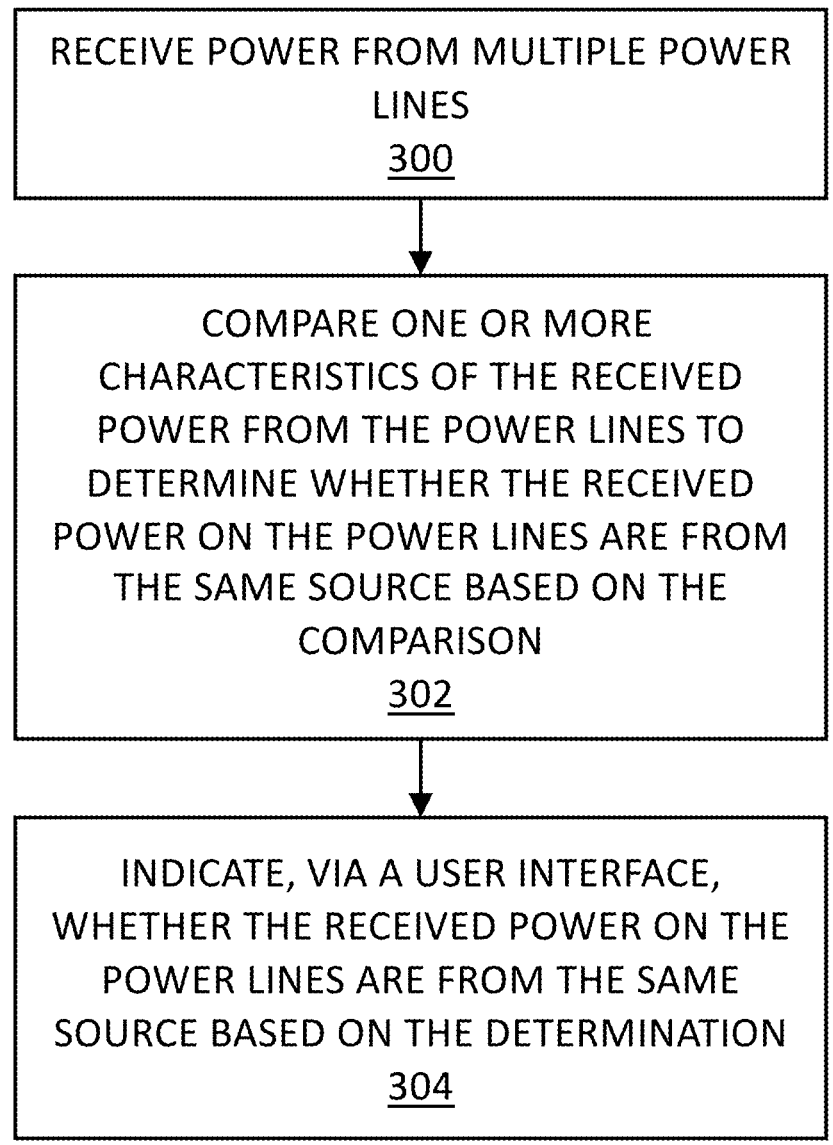
Figure 4:
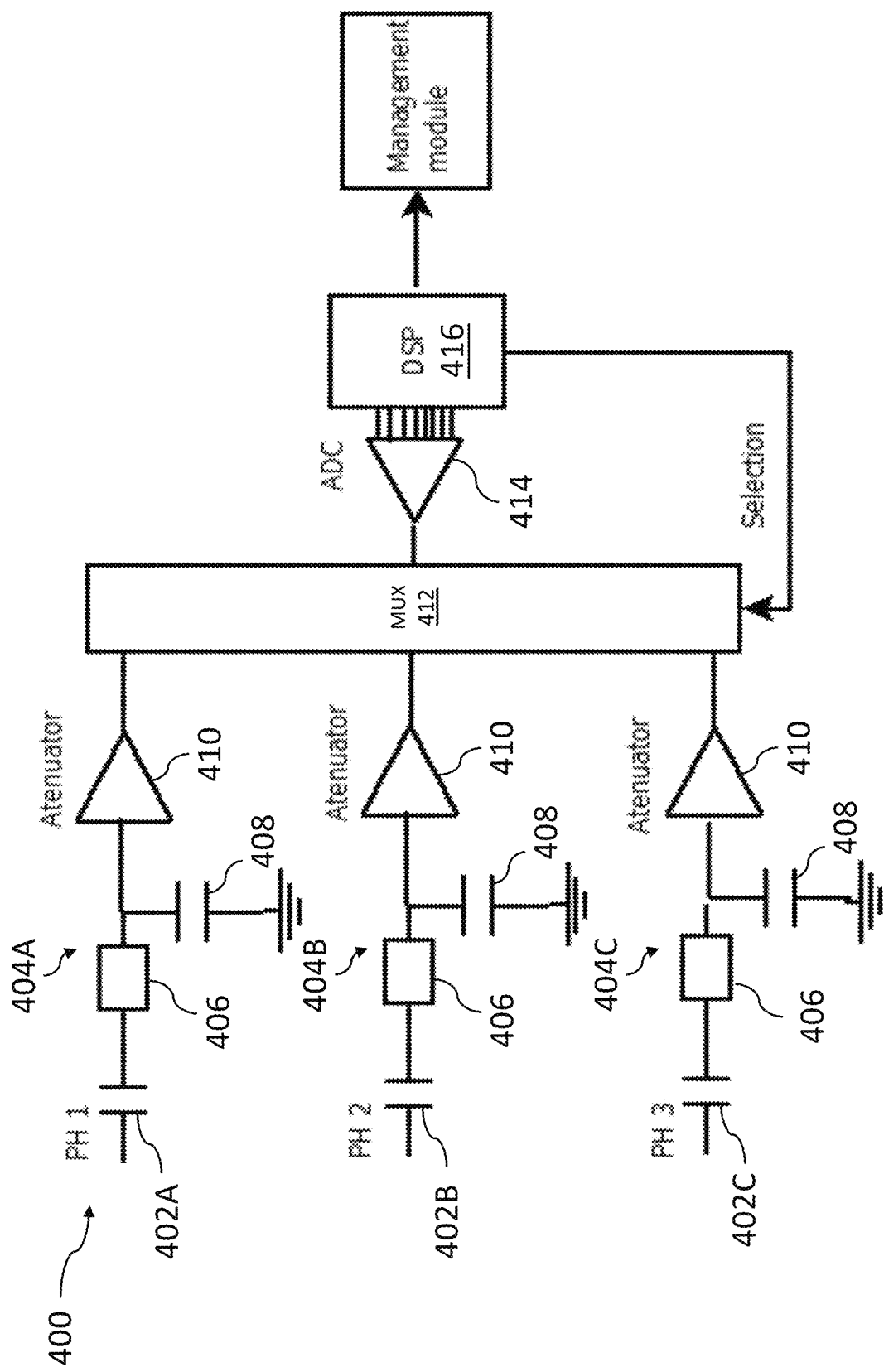
Figure 5A:
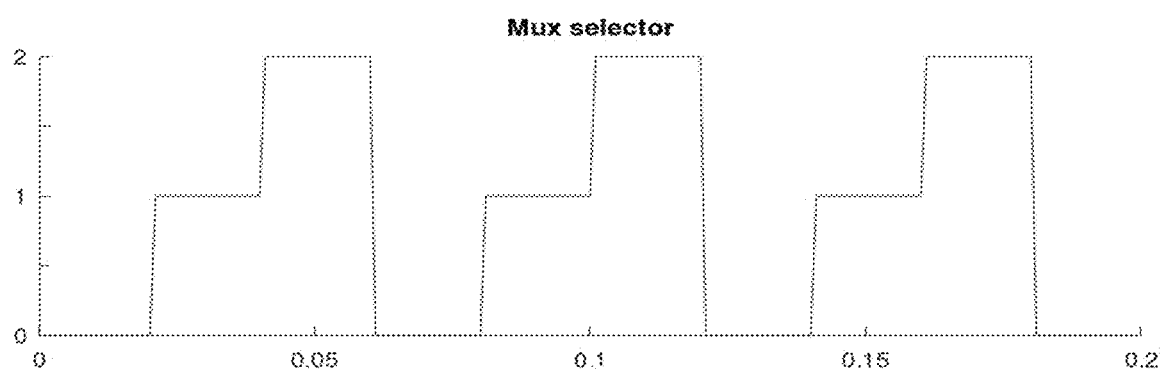
Figure 5B:
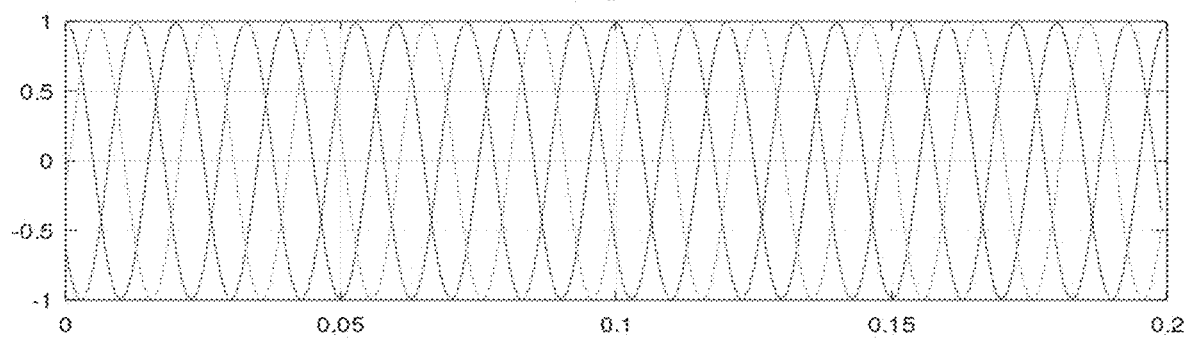
Figure 6:
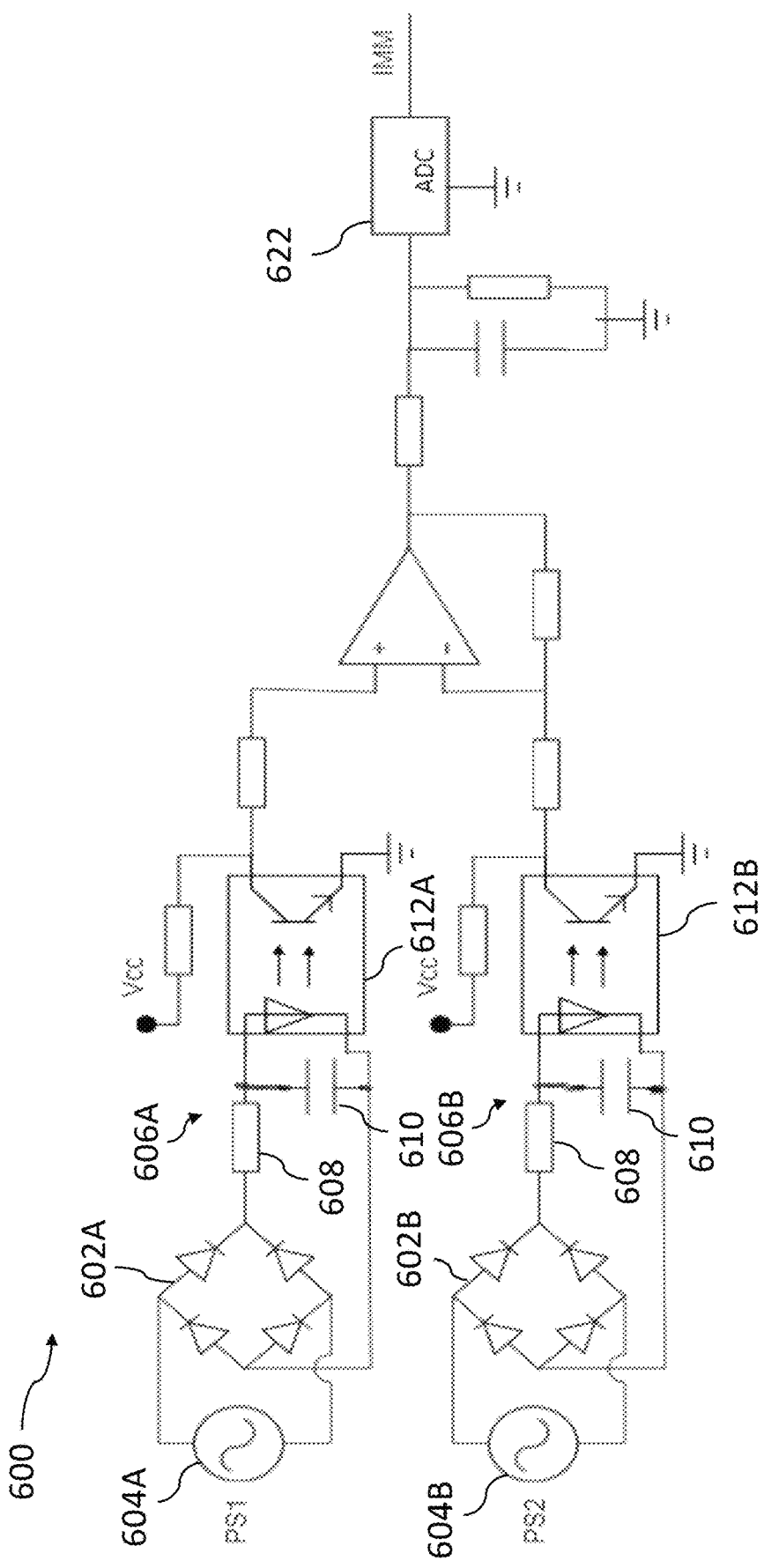
Figure 7:
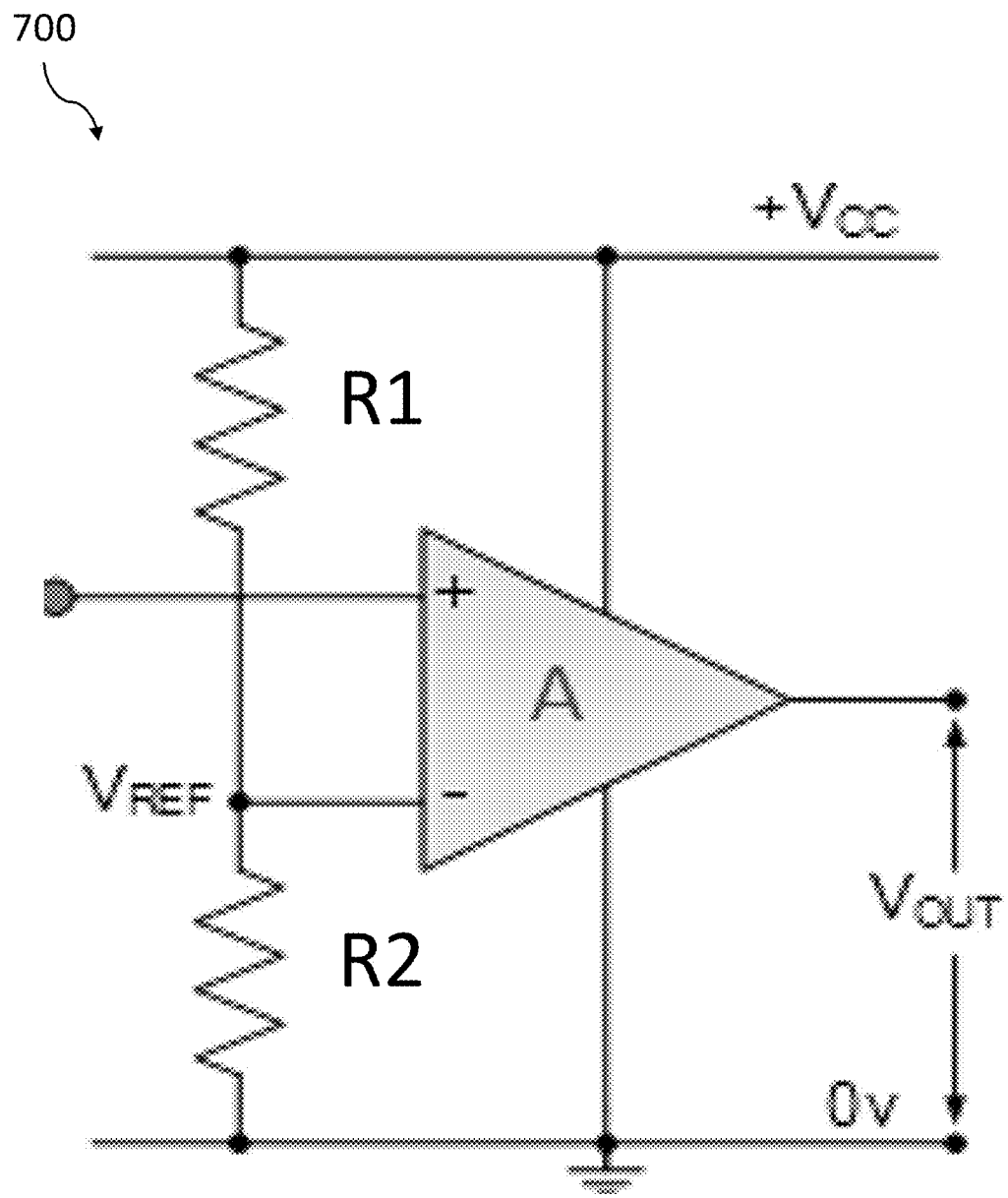
Figure 8:
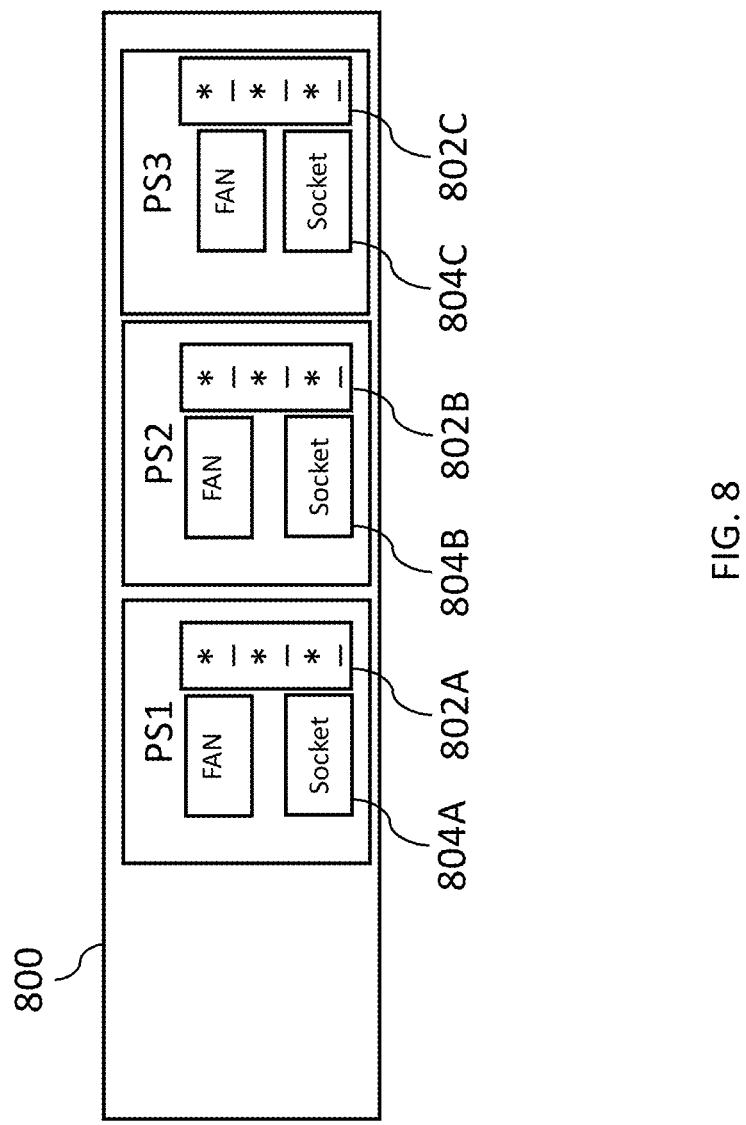

Having thus described the presently disclosed subject matter in general terms, reference will now be made to the accompanying Drawings, which are not necessarily drawn to scale, and wherein:

FIG. 1 is a block diagram of an example power distribution system for a server rack in accordance with embodiments of the present disclosure;

FIG. 2 is a block diagram of another example power distribution system for a server rack in accordance with embodiments of the present disclosure;

FIG. 3 is a flow diagram of an example method for determining and indicating a source of power based on a characteristic of received power in accordance with embodiments of the present disclosure;

FIG. 4 is a block diagram of an example comparator for comparing one or more characteristics of received power on power lines and for determining whether the received power on the power lines are from the same source in accordance with embodiments of the present disclosure;

FIGS. 5A and 5B are graphs that depict multiplexer selection;

FIG. 6 is a block diagram of another example comparator for comparing one or more characteristics of received power on power lines and for determining whether the received power on the power lines is from the same source in accordance with embodiments of the present disclosure;

FIG. 7 illustrates a circuit diagram of an example comparator subsystem for use with the comparator of FIG. 6; and FIG. 8 illustrates a rear view of a server with light sources configured to indicate a source of power based on a characteristic of received power in accordance with embodiments of the present disclosure.

SUMMARY

The presently disclosed subject matter relates to devices and methods for determining and indicating a source of power based on a characteristic of received power. According to an aspect, a device includes a power line interface configured to receive power from multiple power lines. The device also includes a comparator module configured to compare one or more characteristics of the received power from the plurality of power lines. The comparator module is also configured to determine whether the received power on the power lines are from the same source based on the comparison. Further, the device includes a user interface configured to indicate whether the received power on the power lines are from the same source based on the determination.

According to another aspect, a method includes receiving power from a plurality of power lines. Further, the method includes comparing one or more characteristics of the received power from the plurality of power lines and to determine whether the received power on the power lines are from the same source based on the comparison. The method also includes indicating, via a user interface, whether the received power on the power lines are from the same source based on the determination.

DETAILED DESCRIPTION

The following detailed description is made with reference to the figures. Exemplary embodiments are described to illustrate the disclosure, not to limit its scope, which is defined by the claims. Those of ordinary skill in the art will recognize a number of equivalent variations in the description that follows.

Articles "a" and "an" are used herein to refer to one or to more than one (i.e. at least one) of the grammatical object of the article. By way of example, "an element" means at least one element and can include more than one element.

"About" is used to provide flexibility to a numerical endpoint by providing that a given value may be "slightly above" or "slightly below" the endpoint without affecting the desired result.

The use herein of the terms "including," "comprising," or "having," and variations thereof is meant to encompass the elements listed thereafter and equivalents thereof as well as additional elements. Embodiments recited as "including," "comprising," or "having" certain elements are also contemplated as "consisting essentially of" and "consisting" of those certain elements.

Unless otherwise defined, all technical terms used herein have the same meaning as commonly understood by one of ordinary skill in the art to which this disclosure belongs.

The functional units described in this specification have been labeled as computing devices. A computing device may be implemented in programmable hardware devices such as processors, digital signal processors, central processing units, field programmable gate arrays, programmable array logic, programmable logic devices, cloud processing systems, or the like. The computing devices may also be implemented in software for execution by various types of processors. An identified device may include executable code and may, for instance, comprise one or more physical or logical blocks of computer instructions, which may, for instance, be organized as an object, procedure, function, or other construct. Nevertheless, the executable of an identified device need not be physically located together but may comprise disparate instructions stored in different locations which, when joined logically together, comprise the computing device and achieve the stated purpose of the computing device. In another example, a computing device may be a server or other computer located within a data center. A computing device can also include any type of conventional computer, for example, a laptop computer or a tablet computer.

As used herein, the term "memory" is generally a storage device of a computing device. Examples include, but are not limited to, read-only memory (ROM) and random access memory (RAM).

FIG. 1 illustrates a block diagram of an example power distribution system 100 for a server rack 102 in accordance with embodiments of the present disclosure. The server rack 102 includes multiple servers 1-N (references 104A-104N, respectively) and may be one of many server racks housed within a data center. The primary electrical power source 106 enters the data center as a three-phase voltage at 440 Volts Alternating Current (VAC), for example. These three phases may be broken down by a transformer 108 into three-single phase 120 VAC lines 110 as indicated by references L1, L2, and L3. Each electrical power line 110 can be connected to one or more circuit breaker panels 112.

The circuit breaker panel 112 can be connected to a power distribution unit (PDU) 114 in order to provide electrical power to each PDU 114. It is noted that only one PDU 114 is shown here, but it should be understood that multiple PDUs may be used for distributing electrical power to the servers 104A-104N. Further, it should be understood that each PDU may have layered PDUs, where one PDU has an electrical supply output connected to the input of another PDU.

The servers 104A-104N, as well as other electronic devices, are operably connected to the PDUs. As shown server 104A is operably connected to PDU 114 for receiving electrical power. In a data center, the server 104A and other electronic devices may be arranged in the rack 102 and place a load on the PDU 114. Further, the PDU 114 may be placed on the rack 102.

The server 104A includes multiple power supply modules PS1-PS3 (references 116A-116C, respectively) that have inputs for connection to the PDU 114. Particularly, the power supply modules 116A-116C may collectively be referred to as a power line interface and are connected to power lines 118A-118C, respectively. The power lines 118A-118C can each have ends that can operatively connect the PDU 114 to the power supply modules 116A-116C. During installation of the server 104A and maintenance operations, the operator may manually connect the power lines 118A-118C to the power supply modules 116A-116C.

Devices and methods in accordance with embodiments of the present disclosure can determine and indicate a source of power based on one or more characteristics of the power received at the power supply modules 116A-116C. The indication of the source of power can be presented to the operator via a user interface 120. Particularly, the user interface 120 can indicate whether the received power on the power lines 118A-118C are from the same source. It is desired that the power lines 118A-118C are connected such that they supplying power from different sources and thereby power source redundancy is provided to the server 104A.

It is noted that although the server 104A is depicted as being connected to 3 power lines, it should be noted that alternatively the server 104A may be connected to only 2 of the power lines. For example, the servers 104A may be connected to combination of power lines 118A and 118B, 118A and 118C, or 118B and 118C.

In accordance with embodiments, the server 104A includes a comparator 122 configured to compare one or more characteristics of power received from the power lines 118A-118C and to determine whether the received power on the power lines 118A-118C are from the same source based on the comparison. The comparator 122 and its functionality described herein may be implemented by suitable hardware, software, firmware, or combinations thereof. For example, the comparator 122 may be implemented by one or more processors and memory having instructions for implementing the functionality. In this example, the comparator 122 is suitably implemented as part of the server's 104A BMC 124. Alternatively, for example, the comparator 122 may partly be implemented by the BMC 124 or may be entirely implemented by one or more other electronic components.

In accordance with embodiments, the comparator module 122 alone or in combination with one or more other electronic components can determine one or more characteristics of the received power on each of lines 118A-118C. Example characteristics include, but are not limited to, a phase and amplitude of the power. The comparator module 122 can also compare one or more of the same characteristics among the power received on the lines 118A-118C and determine whether the received power on the power lines 118A-118C are from the same source based on the comparison. For example, the comparator module 122 can determine a phase and an amplitude of power received from each of lines 118A-118C. Continuing the example, the comparator module 122 can compare the phase and amplitude of each line to another for determining whether the received power of those compare is from the same source. For example, a matching phase and amplitude among two lines indicates that the received power is from the same source. The user interface 120 can indicate whether the received power on the power lines 118A-118C are from the same source.

The user interface 120 can include one or more light emitters (e.g., light emitting diodes (LEDs)) that are operably connected to the comparator module 122. In this example, the light emitters can generate light based on a source of power on one or more of the power lines. For example, the comparator module 122 can control the light emitter(s) to activate to indicate the particular source of power on the lines 118A-118C. For example, the light emitter(s) may emit a particular color of light (e.g., red, green, blue, etc.) to indicate a source of power for a power line. Light of the same color on different lines indicates that the source of power is the same. Conversely, light of different colors on different lines indicates the source of power is different. The light emitters may be positioned near their respectively line input so that an operator can easily determine which light is associated with which light indicator. PLD 126 can perform signal preprocessing such as, but not limited to, rectifying, attenuation and filtering.

FIG. 2 illustrates a block diagram of another example power distribution system 200 for a server rack 102 in accordance with embodiments of the present disclosure. The system 200 of FIG. 2 is the same as the system 100 of FIG.

1 except that the comparator 122 is not implemented by the BMC 124. Rather, the comparator 122 is implemented by other hardware and software apart from the BMC 124. In this example, the comparator 122 is implemented by other hardware and software (e.g., memory and one or more processors) residing in the server 104A, but it should be understood that the comparator 122 may be implemented by hardware and/or software of the server 104A or apart from the server 104A.

FIG. 3 illustrates a flow diagram of an example method for determining and indicating a source of power based on a characteristic of received power in accordance with embodiments of the present disclosure. The method is described as being implemented by the system 100 shown in FIG. 1, although it should be understood that the method may be implemented by any suitable system.

Referring to FIG. 3, the method includes receiving 300 power from multiple power lines. For example, an installer for the server 104A may suitably place the server 104A in its rack and select which power lines among many to connect to the power supply modules 116A-116C. The installer may desire that the selected power lines are each connected to different power sources so that redundancy of power is provided to the server 104A. However, the installer cannot be sure and selects power lines 118A-118C to connect to power supply modules 116A-116C. Power from the power lines can then provide power to the server 104A. As described in the following, the system can indicate to the installer, via the user interface 120, whether the power lines 118A-118C are providing power from difference sources.

The method of FIG. 3 includes comparing 302 one or more characteristics of the received power from the power lines and to determine whether the received power on the power lines are from the same source based on the comparison. Continuing the aforementioned example, the comparator module 122 a phase and amplitude of the received power on each of lines 118A-118C. Further, the comparator can compare the phase and amplitude for determining whether the received power on the power lines 118A-118C are from the same source. The comparator module 122 can compare the phase and amplitude of each line to another for determining whether the received power of those compare is from the same source. For example, a matching phase and amplitude among two lines indicates that the received power is from the same source. Suitable circuitry can be used, for example, for comparing the phase and the amplitude.

The method of FIG. 3 includes indicating 304, via a user interface, whether the received power on the power lines are from the same source based on the determination. Continuing the aforementioned example, the user interface 120 can indicate whether the received power on the power lines 118A-118C are from the same source.

In accordance with embodiments, the management module of the server may have a menu item for use by the user for selecting between a preference for phase balancing or rack power domain redundancy, or a combination of both. For example, if a preference for rack power domain redundancy is selected, the comparator 122 can operate to balance two rack rails among all the power supply units. In an example, the output from the system in either FIG. 4 or FIG. 6 can inform the BMC or management module that the power received on 2 power lines are in phase or not. In the case of FIG. 4, the DSP can directly communicate how far out of phase two outlets from the PDU are (i.e., degrees mismatch). Similarly, using the circuit in FIG. 6, the BMC can infer how far out of phase the outlets are by comparing the voltages at a point in time and knowing that different phases voltages in a 3 phase system are 120 degrees out of phase. With either implementation, the BMC can use software to add some+/−tolerance to the reported phase degree mismatch. If the mismatch is very small, then the outlets are on the same phase. If the mismatch is large, the outlets are on different phases. If the mismatch is minor (e.g., 1-5%), then the outlets are on the same phase but different rack power domains. The key is the two rack power domains are two different sources back to the point of entry at the datacenter.

In accordance with embodiments, a circuit can compare phase, amplitude, and/or other power characteristic of the receiving power lines feeding the power supplies of electronic equipment, such as computing devices. The output of the circuit can provide to a BMC or other hardware an indication of use of the same power line. The system can monitor the number of active power supplies and the connectivity to the power liens. An indication or alarm can be triggered in response to detection of an unbalanced distribution for the power supply modules to the available power lines.

FIG. 4 illustrates a block diagram of an example comparator 400 for comparing one or more characteristics of received power on power lines and for determining whether the received power on the power lines are from the same source in accordance with embodiments of the present disclosure. Referring to FIG. 4, the comparator 400 includes high-pass filters 402A, 402B, and 402C that can be operatively connected to the power lines at the front end for blocking DC voltages from damaging downstream components. The outputs of the high-pass filters 402A, 402B, and 402C may be operatively connected to respective low-pass filters 404A, 404B, and 404C. The low-pass filters 404A, 404B, and 404C may each include a resistor 406 and a capacitor 408 connected to ground. The low-pass filters 404A, 404B, and 404C can block high frequency noise on the received power (e.g., AC waveform). The outputs of the low-pass filters 404A, 404B, and 404C are connected to respective attenuators 410 for reducing voltage.

The low-pass filters 404A, 404B, and 404C can function to smooth out the incoming AC waveform. It filters out harmonics and makes the incoming AC waveform closer to an ideal sine wave, thereby making it easier for the DSP to do a comparison. As an alternative, the DSP itself could implement low pass filtering in the digital domain. In this case, low-pass filters 404A, 404B, and 404C are not needed.

The comparator 400 includes a multiplexer (MUX) 412 that can be controlled to select between different power supply lines. In other words, the MUX 412 can select, for its input, between the outputs of attenuators 410. The output of the MUX 412 is connected to an analog-to-digital converter (ADC) 414. The output of the ADC 414 is connected to a digital signal processor (DSP) 416. The DSP 416 can sample the ADC 414 output, process the samples, and control the MUX's 412 line selection. The signal may be sampled at a sufficiently high rate for distinguishing among the power lines (e.g., distinguish among the 3 phases in a 3-phase power delivery system).

In operation, the DSP 416 can initially select the first active power line. For example, it may select the power line input into filter 402A if all 3 power supplies are active. The DSP 416 can determine the frequency and phase of the samples. Further, the DSP 416 can switch the MUX channel selector after one signal period time (e.g., 16.66 milliseconds for a 60 Hertz power line). To support 50 or 60 Hz AC power, the DSP can include a routine for accurately measuring the frequency on one of the AC phases. Once the frequency is known, that is used to set the signal period time which controls the MUX channel selector. FIG. 5A depict multiplexer selection logic. The multiplexer channel selection is changed every signal period, during this time the DSP will sample the signal from the selected input and will store in the internal memory the signal samples. FIG. 5B shows the input signals when the inputs are connected to different lines of a three-phase power delivery system. In the example depicted in FIGS. 5A and 5B the multiplexer channel selection change is synchronous to the moment when the signal for the first input cross the zero voltage line.

The switching of the channel selector for the MUX 412 can be synchronous to the phase of the first active power line. Because the power line signal conforms to a sine wave, the DSP 416 can store the phase "1" N samples for one signal period time interface, and then switch to the next line phase "2" and use the samples for the next signal period time interval to perform the processing. The process can be repeated for all power lines. In the case the samples belong to a different time window, they can provide the information needed if it belongs to the same phase. The DSP 416 can check whether the phase is matching for the input power lines. For example, the DSP 416 can check whether the transition from zero to a positive value happens at the same time for the power lines being compared. This approach can allow for use of a single ADC to compare multiple power line inputs. The output from the DSP can subsequently be fed to a system management subsystem (e.g., a BMC, XCC, or IMM), which can interpret the DSP output and set flags or alarms to indicate to the user that there is a misconnection. In an example, the comparator can control the user interface to indicate the amount of phase misalignment among phases.

FIG. 6 illustrates a block diagram of another example comparator 600 for comparing one or more characteristics of received power on power lines and for determining whether the received power on the power lines is from the same source in accordance with embodiments of the present disclosure. Referring to FIG. 6, the comparator 600 includes signal rectifiers 602A and 602B at the front end for converting respective AC power signals 604A and 604B to single-directional DC power signals. The outputs of the signal rectifiers 602A and 602B may be operatively connected to respective low-pass filters 606A and 606B. The low-pass filters 606A and 606B may each include a resistor 608 and a capacitor 610. The low-pass filters 606A and 606B can block high frequency noise on the received power (e.g., AC waveform). The outputs of the low-pass filters 606A and 606B are connected to respective optocouplers 612A and 612B for transferring electrical signals by use of light. It is noted that optocouplers 612A and 612B may be substituted for attenuators.

An analog comparator circuit compares the output signal from two optocoupler blocks like 612A and 612B. The comparator block contains one differential amplifier and two resistors. The output of the comparator will be zero if both input signals are identical. The output of the comparator block if connected to a low-pass filter used to filter-out any transient signal noise. An ADC 622 with an I2C interface can be integrated with a suitable management module or may be a comparator as shown in FIG. 7, for example. Such a configuration can provide a I/O indication of power line identity. It is noted that the sampling points for the comparisons are 120 Hz or 100 Hz.

FIG. 7 illustrates a circuit diagram of an example comparator subsystem 700 for use with the comparator 600 of FIG. 6. Referring to FIG. 7, the system 700 can be used to determine whether an input voltage is greater than a threshold X Volts. This determination can be made if the lines are out of phase. The value X sets the noise and phase rejection threshold. A power line identity detection circuit may be installed between each of the two power lines. The comparator subsystem 700 contains one differential amplifier and two resistors. The ratio between the two resistors and the voltage of the Vcc line will determine the Vref voltage, Vref=Vcc*Bottom resistor value/(Top resistor value+Bottom resistor value).

FIG. 8 is a rear view of a server 800 with light sources 802A, 802B, and 802B operable to indicate a source of power based on a characteristic of received power in accordance with embodiments of the present disclosure. Referring to FIG. 8, the light sources 802A, 802B, and 802C can be LEDs operably connected to a comparator (not shown) to receive control signals for indicating a source of power of a cable plugged into a respective socket 804A, 804B, and 804C, respectively, in accordance with embodiments disclosed herein. For example, the LEDS can emit a particular color of light to indicate its source of power. Matching colors for any of the light sources 802A, 802B, and 802C can indicate the same source of power, and thus the operator should change at least one of the cables for redundancy of power source.

An executable code of a computing device may be a single instruction, or many instructions, and may even be distributed over several different code segments, among different applications, and across several memory devices. Similarly, operational data may be identified and illustrated herein within the computing device, and may be embodied in any suitable form and organized within any suitable type of data structure. The operational data may be collected as a single data set, or may be distributed over different locations including over different storage devices, and may exist, at least partially, as electronic signals on a system or network.

The device or system for performing one or more operations on a memory of a computing device may be a software, hardware, firmware, or combination of these. The device or the system is further intended to include or otherwise cover all software or computer programs capable of performing the various heretofore-disclosed determinations, calculations, or the like for the disclosed purposes. For example, exemplary embodiments are intended to cover all software or computer programs capable of enabling processors to implement the disclosed processes. Exemplary embodiments are also intended to cover any and all currently known, related art or later developed non-transitory recording or storage mediums (such as a CD-ROM, DVD-ROM, hard drive, RAM, ROM, floppy disc, magnetic tape cassette, etc.) that record or store such software or computer programs. Exemplary embodiments are further intended to cover such software, computer programs, systems and/or processes provided through any other currently known, related art, or later developed medium (such as transitory mediums, carrier waves, etc.), usable for implementing the exemplary operations disclosed below.

In accordance with the exemplary embodiments, the disclosed computer programs can be executed in many exemplary ways, such as an application that is resident in the memory of a device or as a hosted application that is being executed on a server and communicating with the device application or browser via a number of standard protocols, such as TCP/IP, HTTP, XML, SOAP, REST, JSON and other sufficient protocols. The disclosed computer programs can be written in exemplary programming languages that execute from memory on the device or from a hosted server, such as BASIC, COBOL, C, C++, Java, Pascal, or scripting languages such as JavaScript, Python, Ruby, PHP, Perl, or other suitable programming languages.

The present subject matter may be a system, a method, and/or a computer program product. The computer program product may include a computer readable storage medium (or media) having computer readable program instructions thereon for causing a processor to carry out aspects of the present subject matter.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a RAM, a ROM, an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network, or Near Field Communication. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present subject matter may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++, Javascript or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present subject matter.

Aspects of the present subject matter are described herein with reference to flowchart illustrations and/or block diagrams of methods, apparatus (systems), and computer program products according to embodiments of the subject matter. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present subject matter. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the embodiments have been described in connection with the various embodiments of the various figures, it is to be understood that other similar embodiments may be used, or modifications and additions may be made to the described embodiment for performing the same function without deviating therefrom. Therefore, the disclosed embodiments should not be limited to any single embodiment, but rather should be construed in breadth and scope in accordance with the appended claims.

What is claimed is:

1. A device comprising:
   a power line interface configured to receive power from each power line of a plurality of power lines;
   a comparator module configured to compare at least one electrical signal characteristic of the received power from each of the plurality of power lines and to determine whether the received power on the power lines are from the same source based on the comparison; and
   a user interface configured to indicate whether the received power on the power lines are from the same source based on the determination.

2. The device of claim 1, wherein the at least one electrical signal characteristic of the received power comprises a phase or an amplitude of the received power.

3. The device of claim 1, wherein the power line interface is configured to connect to the plurality of power lines, and wherein the received power is three-phase power.

4. The device of claim 1, wherein the power line interface is configured to distribute the received power to one or more computing devices.

5. The device of claim 4, wherein the computing devices are servers, storage and/or network equipment.

6. The device of claim 1, wherein the comparator module comprises a baseboard management controller (BMC).

7. The device of claim 1, wherein the comparator comprises:
   analog electronic devices configured to filter the received power;
   an analog-to-digital converter configured to convert the filtered, received power to digital signals representative of the filtered, received power; and
   a digital processor configured to receive the digital signals, to compare the at least one electrical signal characteristic of the received power from the plurality of power lines based on the digital signals, and to determine whether the received power on the power lines is from the same source based on the comparison.

8. The device of claim 1, wherein the comparator comprises analog electronic devices configured to compare the at least one electrical signal characteristic of the received power from the plurality of power lines, and to determine whether the received power on the power lines is from the same source based on the comparison.

9. The device of claim 1, wherein the user interface comprises at least one light emitter configured to generate light based on a source of power on at least one of the power lines.

10. The device of claim 1, wherein the user interface comprises a plurality of light emitters associated with the power lines and configured to indicate a source of power for each of the power lines.

11. The device of claim 1, further comprising a plurality of inputs each configured to connect to a respective one of the power lines, and
    wherein the user interface comprises a plurality of light emitters that are each associated with a different one of the inputs, and wherein each light emitter is configured to indicate a source of power for the power line connected to its respective input.

12. A method comprising:
    receiving power from each power line of a plurality of power lines;
    comparing at least one electrical signal characteristic of the received power from the plurality of power lines and to determine whether the received power on the power lines are from the same source based on the comparison; and
    indicating, via a user interface, whether the received power on the power lines are from the same source based on the determination.

13. The method of claim 12, wherein the at least one electrical signal characteristic of the received power comprises a phase or an amplitude of the received power.

14. The method of claim 12, wherein the received power is three-phase power.

15. The method of claim 12, further comprising distributing the received power to one or more computing, storage, or networking devices.

16. The method of claim 12, wherein the comparison is performed by a baseboard management controller (BMC).

17. The method of claim 12, wherein the comparing comprises:
    using analog filters to filter the received power;
    converting the filtered, received power to digital signals representative of the filtered, received power;
    comparing the at least one electrical signal characteristic of the received power from the plurality of power lines based on the digital signals; and
    determining whether the received power on the power lines is from the same source based on the comparison.

18. The method of claim 12, further comprising using analog electronic devices to:
    compare the at least one electrical signal characteristic of the received power from the plurality of power lines; and
    determine whether the received power on the power lines is from the same source based on the comparison.

19. The method of claim 12, wherein the user interface comprises at least one light emitter configured to generate light based on a source of power on at least one of the power lines.

20. The method of claim 12, wherein the user interface comprises a plurality of light emitters associated with the power lines and configured to indicate a source of power for each of the power lines.

* * * * *